US012693988B2

(12) United States Patent
Liu

(10) Patent No.: US 12,693,988 B2
(45) Date of Patent: Jul. 28, 2026

(54) DIGITAL POWER SOURCE HAVING ADJUSTABLE POWER-ON TIME INTERVAL AND SLEW RATE, AND ADJUSTMENT METHOD

(71) Applicant: SUZHOU METABRAIN INTELLIGENT TECHNOLOGY CO., LTD., Suzhou (CN)

(72) Inventor: Rengqing Liu, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/146,509

(22) PCT Filed: Sep. 29, 2024

(86) PCT No.: PCT/CN2024/122121

§ 371 (c)(1),
(2) Date: Jul. 8, 2025

(87) PCT Pub. No.: WO2025/139144

PCT Pub. Date: Jul. 3, 2025

(65) Prior Publication Data

US 2026/0111383 A1      Apr. 23, 2026

(30) Foreign Application Priority Data

Dec. 28, 2023      (CN) .......................... 202311840203.7

(51) Int. Cl.
*G06F 13/40*          (2006.01)
*G06F 1/26*           (2006.01)
*H03K 7/08*           (2006.01)

(52) U.S. Cl.
CPC ............ *G06F 13/4068* (2013.01); *G06F 1/26* (2013.01); *H03K 7/08* (2013.01)

(58) Field of Classification Search
CPC .......... G06F 13/4068; G06F 1/26; H03K 7/08
See application file for complete search history.

(56) References Cited

U.S. PATENT DOCUMENTS

2011/0278927 A1* 11/2011 Phadke ................. H02M 3/285
                                                     323/267
2012/0204055 A1    8/2012 Paul et al.
(Continued)

FOREIGN PATENT DOCUMENTS

CN          101656431 A      2/2010
CN          109358740 A      2/2019
(Continued)

*Primary Examiner* — Henry Tsai
*Assistant Examiner* — Harry Z Wang
(74) *Attorney, Agent, or Firm* — IPro, PLLC

(57)          ABSTRACT

The present disclosure relates to the technical field of solid state drives, and discloses a digital power supply with adjustable power-on time interval and slew rate and an adjusting method. The digital power supply provides working power for the digital power supply by the power supply circuit, and is integrally controlled by the main control circuit including the main control device and the first interface, and outputs voltage by a multi-channel power supply adjustable circuit including a step-down circuit composed of a first MOS, a second MOS and a filter capacitor, wherein each power supply adjustable circuit corresponds to a power supply rail in the SSD, and in this process, external control parameters are received through the first interface in the main control circuit.

20 Claims, 6 Drawing Sheets

(56)     References Cited

U.S. PATENT DOCUMENTS

| | | | | |
|---|---|---|---|---|
| 2017/0248996 A1* | 8/2017 | Zhang | ........................ | G06F 1/26 |
| 2018/0120910 A1* | 5/2018 | Farkas | .................... | G06F 1/266 |
| 2021/0288576 A1* | 9/2021 | Rizzolatti | ............. | H02M 1/007 |
| 2021/0375335 A1 | 12/2021 | Zhu | | |
| 2021/0389793 A1* | 12/2021 | Baek | ........................ | G06F 1/12 |
| 2022/0069704 A1* | 3/2022 | Puggelli | ................ | H02M 3/158 |
| 2022/0137687 A1* | 5/2022 | Chun | ........................ | G06F 1/26 |
| | | | | 713/300 |

FOREIGN PATENT DOCUMENTS

| | | | |
|---|---|---|---|
| CN | 113644819 A | 11/2021 |
| CN | 215340746 U | 12/2021 |
| CN | 114967561 A | 8/2022 |
| CN | 114977794 A | 8/2022 |
| CN | 116129951 A | 5/2023 |
| CN | 116800081 A | 9/2023 |
| CN | 117493247 A | 2/2024 |
| CN | 118605676 A | 9/2024 |

* cited by examiner

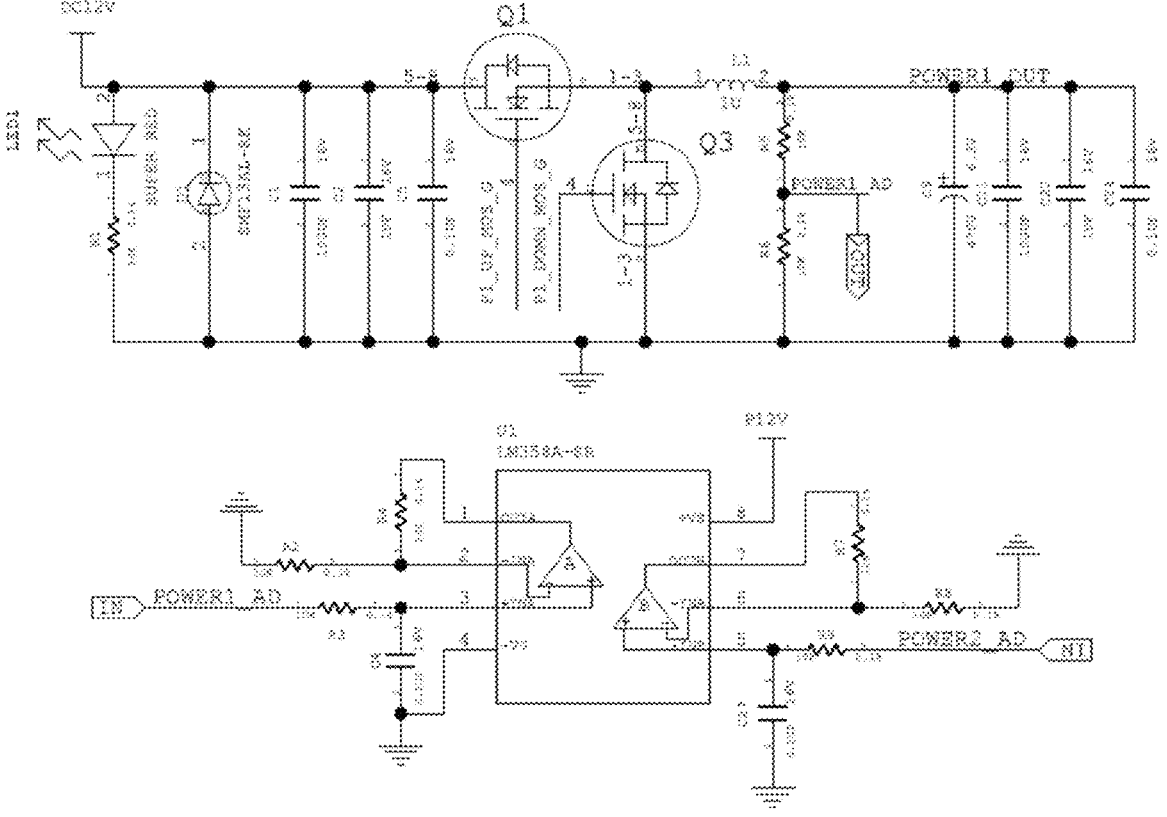
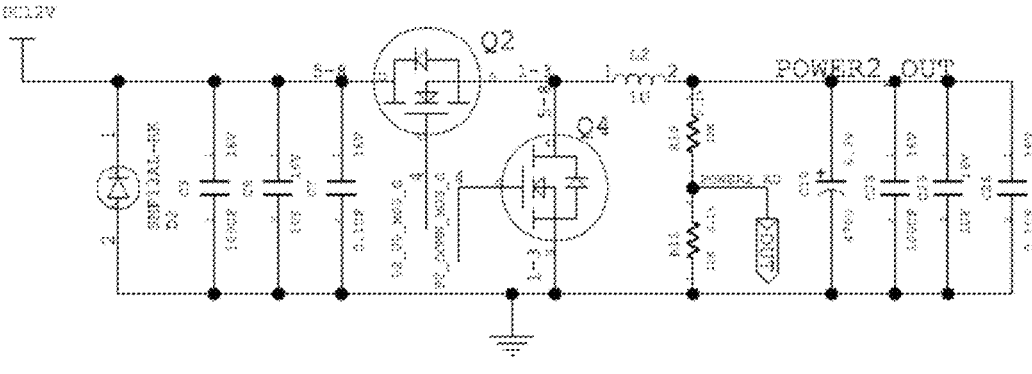
FIG. 3

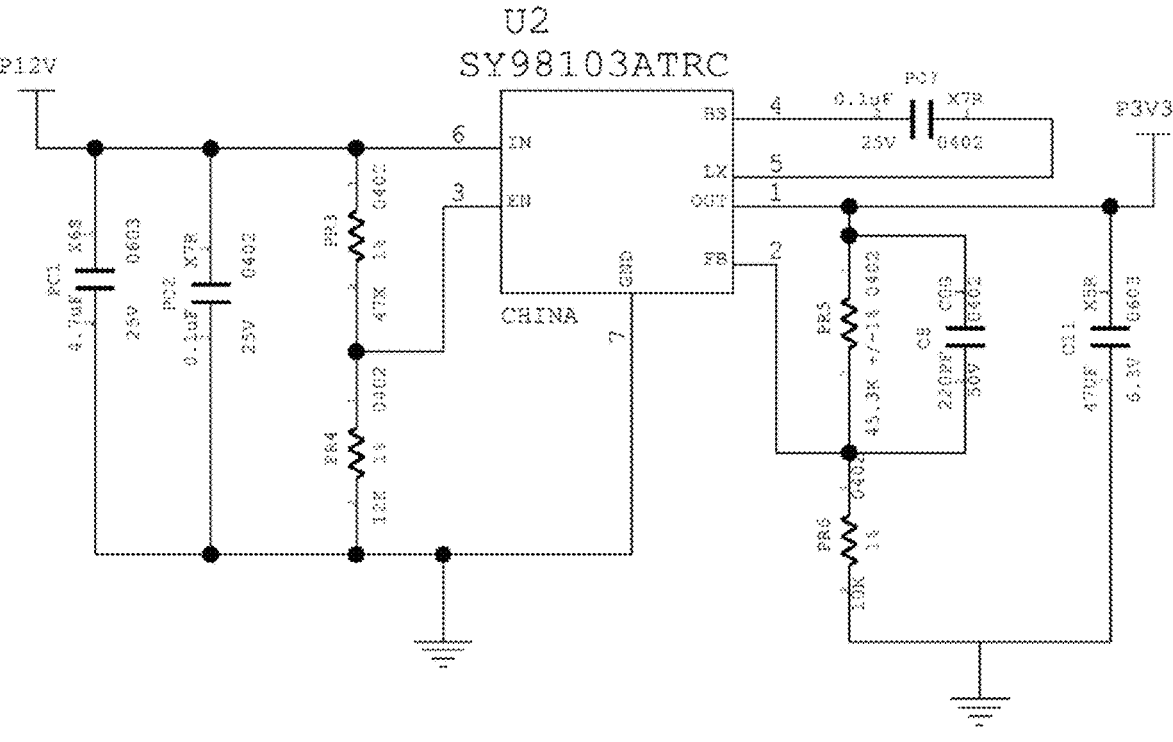

FIG. 4

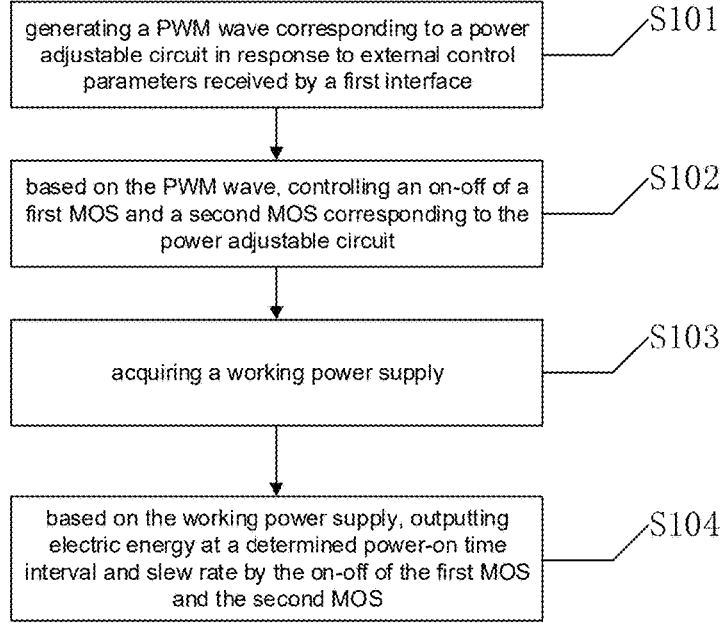

| generating a PWM wave corresponding to a power adjustable circuit in response to external control parameters received by a first interface | S101 |

| based on the PWM wave, controlling an on-off of a first MOS and a second MOS corresponding to the power adjustable circuit | S102 |

| acquiring a working power supply | S103 |

| based on the working power supply, outputting electric energy at a determined power-on time interval and slew rate by the on-off of the first MOS and the second MOS | S104 |

FIG. 5

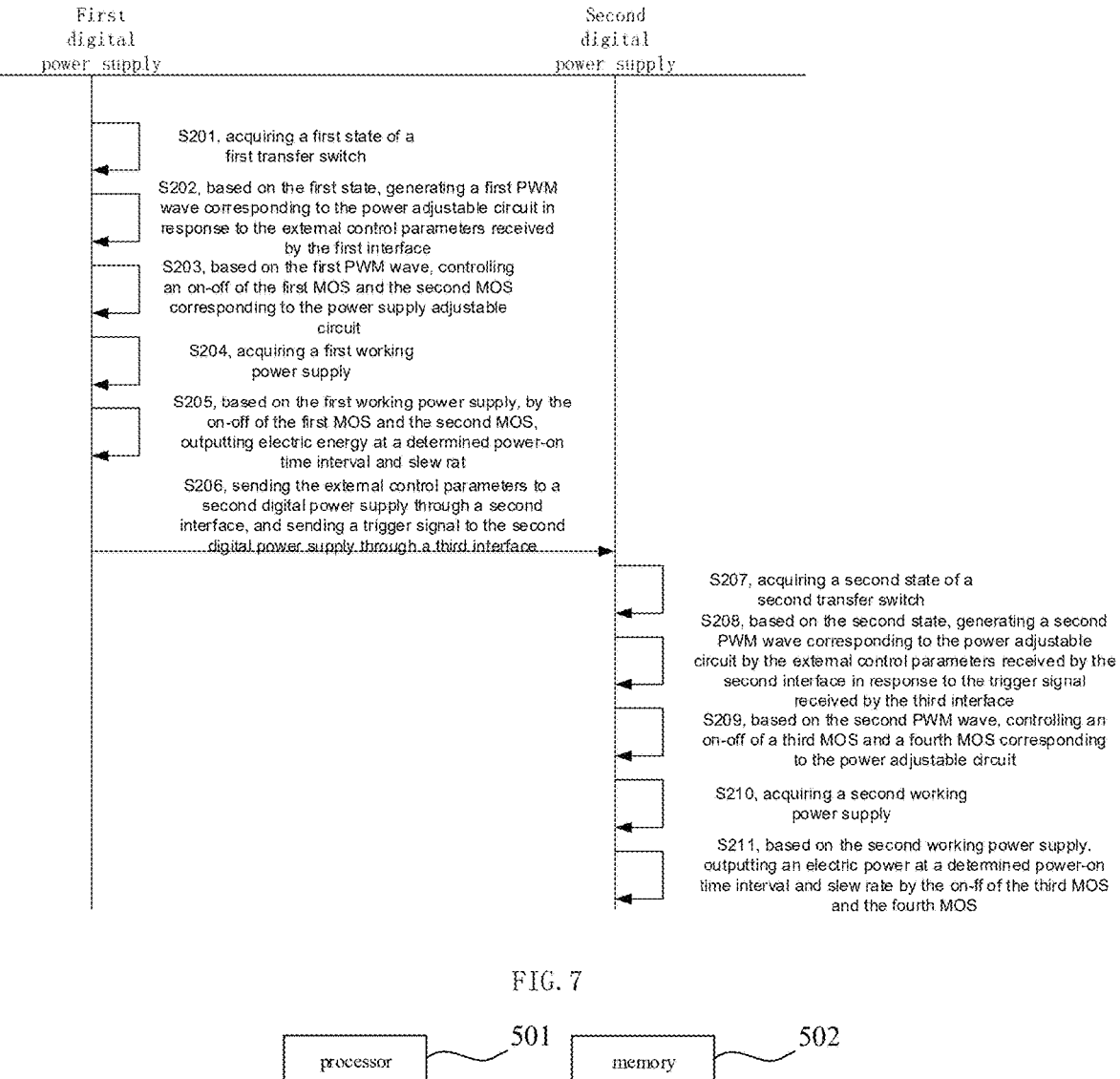

First
digital
power supply

Second
digital
power supply

S201, acquiring a first state of a
first transfer switch

S202, based on the first state, generating a first PWM
wave corresponding to the power adjustable circuit in
response to the external control parameters received
by the first interface S203, based on the first PWM wave, controlling
an on-off of the first MOS and the second MOS
corresponding to the power supply adjustable
circuit S204, acquiring a first working
power supply S205, based on the first working power supply, by the
on-off of the first MOS and the second MOS,
outputting electric energy at a determined power-on
time interval and slew rat S206, sending the external control parameters to a
second digital power supply through a second
interface, and sending a trigger signal to the second
digital power supply through a third interface S207, acquiring a second state of a
second transfer switch S208, based on the second state, generating a second
PWM wave corresponding to the power adjustable
circuit by the external control parameters received by the
second interface in response to the trigger signal
received by the third interface S209, based on the second PWM wave, controlling an
on-off of a third MOS and a fourth MOS corresponding
to the power adjustable circuit S210, acquiring a second working
power supply S211, based on the second working power supply,
outputting an electric power at a determined power-on
time interval and slew rate by the on-ff of the third MOS
and the fourth MOS

FIG. 7 processor          501          memory          502 communication
interface          503

FIG. 8

DIGITAL POWER SOURCE HAVING ADJUSTABLE POWER-ON TIME INTERVAL AND SLEW RATE, AND ADJUSTMENT METHOD

CROSS-REFERENCE TO RELATED APPLICATION

The present disclosure claims the priority of Chinese patent application filed in CNIPA on Dec. 28, 2023, with the application number of 202311840203.7 and the application name of "DIGITAL POWER SOURCE HAVING ADJUSTABLE POWER-ON TIME INTERVAL AND SLEW RATE, AND ADJUSTMENT METHOD", the entire contents of which are incorporated into the present disclosure by reference.

FIELD

The embodiments of the present disclosure relates to the technical field of solid state drives, in particular to a digital power supply with adjustable power-on time interval and slew rate and an adjusting method.

BACKGROUND

Solid State Drives (SSD) is a kind of high performance storage device. In the era of cloud computing, massive data storage and transmission need a large-capacity storage carrier platform. With the wide application of SSD in storage service system, the efficiency of data operation and storage has been significantly improved.

Generally, there are multiple power rails in SSD, and there are requirements for the power-on sequence of different power rails, and even sometimes there are certain requirements for the power-on interval time and output slew rate between the two power rails. Facing the complex timing requirements, the existing test power supply cannot control the power-on interval and power-on slew rate between different channels, that is, the existing test power supply cannot meet the test requirements of SSD.

SUMMARY

In view of this, the present disclosure provides a digital power supply with an adjustable power-on time interval and slew rate and an adjustment method, to solve the technical problem that the power-on time interval and power-on slew rate between different channels of SSD are uncontrollable in the related art.

The present disclosure provides a digital power supply with adjustable power-on time interval and slew rate, wherein the digital power supply includes a main control circuit, a power supply circuit and a plurality of power supply adjustable circuits, wherein the main control circuit is respectively connected to the power supply circuit and each power supply adjustable circuit, wherein, the power supply circuit is configured to provide working power for the digital power supply; the main control circuit includes a main control device and a first interface, and is configured to respond to external control parameters received by the first interface, and send pulse-width modulation (PWM) waves to each power adjustable circuit through a first pair of pins of the main control device; each power supply adjustable circuit includes a first metal oxide semiconductor (MOS), a second MOS and a filter capacitor, wherein the first MOS, the second MOS and the filter capacitor together form a step-down circuit, and the power supply adjustable circuits are configured to control an on-off of the first MOS and the second MOS in response to the PWM waves of the main control circuit, and output electric energy at a determined power-on time interval and slew rate through the step-down circuit.

As an optional embodiment, the main control circuit is further configured to sample a voltage value of each power supply adjustable circuit, and calculate and output PWM waves by digital proportion integration differentiation (PID) based on the voltage value.

As an optional embodiment, each power supply adjustable circuit further includes a feedback resistor and an operational amplifier, wherein the feedback resistor forms a low-pass filter circuit through the operational amplifier, and the low-pass filter circuit is configured to feed back the output voltage value of the corresponding power supply adjustable circuit in response to a voltage sampling requirement of the main control circuit.

As an optional embodiment, the main control circuit further includes a first frequency crystal oscillator and a second frequency crystal oscillator, and the first frequency crystal oscillator and the second frequency crystal oscillator are configured to provide clock signals.

As an optional embodiment, the main control circuit further includes a first indicator light, and the first indicator light is configured to indicate working states of the main control circuit.

As an optional embodiment, the first indicator light is configured to have a long bright state and a blinking state, wherein the long bright state is used to indicate that the working state of the main control circuit is a normal state, and the blinking state is used to indicate that the working state of the main control circuit is a fault state.

As an optional embodiment, each power supply adjustable circuit further includes a clamping diode, and the clamping diode is configured to receive an input voltage and protect downstream circuits.

As an optional embodiment, each of the power supply adjustable circuits further includes a second indicator light, and the second indicator is configured to indicate whether the corresponding power supply adjustable circuit has an input voltage.

The present disclosure provides an adjustment method of a digital power supply with an adjustable power-on time interval and slew rate, applied to the digital power supply according to the above first aspect or any one of the corresponding embodiments, including: generating a PWM wave corresponding to a power adjustable circuit in response to external control parameters received by a first interface; based on the PWM wave, controlling an on-off of a first MOS and a second MOS corresponding to the power adjustable circuit; acquiring a working power supply; based on the working power supply, outputting electric energy at a determined power-on time interval and slew rate by the on-off of the first MOS and the second MOS.

As an optional embodiment, generating a PWM wave corresponding to a power adjustable circuit in response to external control parameters received by a first interface includes: sampling a voltage value of the corresponding power adjustable circuit; generating a corresponding PWM wave by digital PID based on the voltage value.

As an optional embodiment, the power supply adjustable circuit includes a low-pass filter circuit, and the low-pass filter circuit includes a feedback resistor and an operational amplifier, the sampling a voltage value of the corresponding power adjustable circuit, including: outputting the voltage value of the corresponding power adjustable circuit by the low-pass filter circuit in the power adjustable circuit, wherein the voltage value is obtained by sampling the power adjustable circuit by the low-pass filter circuit in response to the voltage sampling requirement of the main control circuit.

As an optional embodiment, generating a corresponding PWM wave by digital PID based on the voltage value includes: calculating the voltage value by using the digital PID to obtain a target duty ratio of the PWM wave to be output; generating the PWM wave of the target duty ratio by the main control device.

As an optional embodiment, based on the working power supply, outputting electric energy at a determined power-on time interval and slew rate by the on-off of the first MOS and the second MOS includes: based on the working power supply, controlling the corresponding power supply adjustable circuit to be powered on at a certain time interval by the on-off of the first MOS and the second MOS; based on the working power supply, controlling the corresponding power supply adjustable circuit to reach a preset electric energy at a certain time by the on-off of the first MOS and the second MOS.

As an optional embodiment, based on the working power supply, controlling the corresponding power supply adjustable circuit to be powered on at a certain time interval by the on-off of the first MOS and the second MOS includes: controlling a power-on timing of the corresponding power supply adjustable circuit by the on-off of the first MOS and the second MOS, wherein the power-on timing is used for adjusting a power-on time interval of the power supply adjustable circuit.

As an optional embodiment, based on the working power supply, controlling the corresponding power supply adjustable circuit to reach a preset electric energy at a certain time by the on-off of the first MOS and the second MOS includes: controlling a target time required for the voltage of the power supply adjustable circuit to reach the output voltage value from 0V by the on-off the first MOS and the second MOS, wherein the target time is used for adjusting a power-on slew rate of the power supply adjustable circuit.

The present disclosure provides a parallel-operable digital power supply with an adjustable power-on time interval and slew rate, including at least two digital power supplies of the first aspect or any one of the corresponding embodiments thereof, wherein, the main control circuit further includes a second interface, a third interface and a transfer switch, wherein the transfer switch is configured to indicate an execution priority of each digital power supply; the second interface is configured to transmit external control parameters between at least two digital power supplies; and the third interface is configured to transmit trigger signals between at least two digital power supplies.

As an optional embodiment, the third interface is a second pair of pins of the main control device, and the at least two digital power supplies include a first digital power supply and a second digital power supply, and the execution priority of the first digital power supply is higher than that of the second digital power supply; the main control circuit of the first digital power supply is configured to send a trigger signal to the second digital power supply through the second pair of pins of the first digital power supply; the main control circuit of the second digital power supply is configured to respond to the trigger signal, receive external control parameters through the second interface of the second digital power supply, and send PWM waves to each power supply adjustable circuit corresponding to the second digital power supply through the first pair of pins of the main control device of the second digital power supply.

The present disclosure provides a parallel-operable adjustment method of a digital power supply with an adjustable power-on time interval and slew rate, applied to the first digital power supply in the parallel-operable digital power supply according to the above third aspect or any one of the corresponding embodiments thereof, wherein the execution priority of the first digital power supply is higher than that of the second digital power supply, including: acquiring a first state of a first transfer switch; based on the first state, generating a first PWM wave corresponding to the power adjustable circuit in response to the external control parameters received by the first interface; based on the first PWM wave, controlling an on-off of the first MOS and the second MOS corresponding to the power supply adjustable circuit; acquiring a first working power supply; based on the first working power supply, by the on-off of the first MOS and the second MOS, outputting electric energy at a determined power-on time interval and slew rate; sending the external control parameters to a second digital power supply through a second interface, and sending a trigger signal to the second digital power supply through a third interface.

The present disclosure provides a parallel-operable adjustment method of a digital power supply with an adjustable power-on time interval and slew rate, applied to the second digital power supply in the parallel-operable digital power supply according to the above third aspect or any one of the corresponding embodiments thereof, wherein the execution priority of the first digital power supply is higher than that of the second digital power supply, the method including: acquiring a second state of a second transfer switch; based on the second state, generating a second PWM wave corresponding to the power adjustable circuit by the external control parameters received by the second interface in response to the trigger signal received by the third interface; based on the second PWM wave, controlling an on-off of a third MOS and a fourth MOS corresponding to the power adjustable circuit; acquiring a second working power supply; based on the second working power supply, outputting an electric power at a determined power-on time interval and slew rate by the on-ff of the third MOS and the fourth MOS.

The present disclosure provides a computer device, including: a memory and a processor, wherein the memory and the processor are in communication connection with each other, and computer instructions are stored in the memory, and the processor executes the computer instructions, to execute the method according to the above first aspect, the fourth aspect, the fifth aspect or any one of the corresponding embodiments thereof.

The technical solution of the digital power supply with the adjustable power-on time interval and slew rate and the adjustment method provided by the present disclosure have the following advantages.

The digital power supply provides working power for the digital power supply by the power supply circuit, and is integrally controlled by the main control circuit including the main control device and the first interface, and outputs voltage by a multi-channel power supply adjustable circuit including a step-down circuit composed of a first MOS, a second MOS and a filter capacitor, wherein each power supply adjustable circuit corresponds to a power supply rail in the SSD, and in this process, external control parameters are received through the first interface in the main control circuit. The main control device is used to generate a PWM wave that responds to external control parameters, and the PWM wave is sent to each power adjustable circuit by the first pair of pins, and the first MOS and the second MOS in each power adjustable circuit are controlled by the PWM wave, and each power adjustable circuit is controlled by the step-down circuit to output a stable voltage at a determined power-on time interval and power-on slew rate.

BRIEF DESCRIPTION OF THE DRAWINGS

In order to explain the specific embodiments of the present disclosure or the technical solutions in the prior art more clearly, the drawings needed in the description of the specific embodiments or the prior art will be briefly introduced below. Apparently, the drawings in the following description are some embodiments of the present disclosure. For the persons skilled in the art, other drawings can be obtained according to these drawings without creative work.

FIG. 3 is a schematic diagram of a power supply adjustable circuit of a digital power supply with adjustable power-on time interval and slew rate provided according to an embodiment of the present disclosure;

FIG. 4 is a schematic diagram of a power supply circuit of a digital power supply with adjustable power-on time interval and slew rate provided according to an embodiment of the present disclosure;

FIG. 5 is a flow diagram of an adjustment method of a digital power supply with adjustable power-on time interval and slew rate according to an embodiment of the present disclosure;

FIG. 7 is an interactive flow diagram of a parallel-operable adjustment method of a digital power supply with adjustable power-on time interval and slew rate according to an embodiment of the present disclosure;

FIG. 8 is a schematic diagram of a hardware structure of a computer device according to an embodiment of the present disclosure;

REFERENCE NUMERAL

U1—operational amplifier; U2—power supply circuit; U3—main control device; J1—first interface; J2—second interface; J3—third interface; SW1—transfer switch; Y1—first frequency crystal oscillator; Y2—second frequency crystal oscillator; R5, R6—feedback resistor; D1—feedforward diode; C9—filter capacitor; Q1, Q3—first MOS; Q2, Q4—second MOS; LED1—second indicator light; LED2—first indicator light.

DETAILED DESCRIPTION

In order to make the purpose, technical solution and advantages of the embodiments of the present disclosure clearer, the technical solution in the embodiments of the present disclosure will be described clearly and completely with the attached drawings. Apparently, the described embodiments are a part of the embodiments of the present disclosure, but not the whole embodiment. Based on the embodiments in the present disclosure, all other embodiments obtained by those skilled in the art without creative work belong to the protection scope of the present disclosure.

Figure 1:
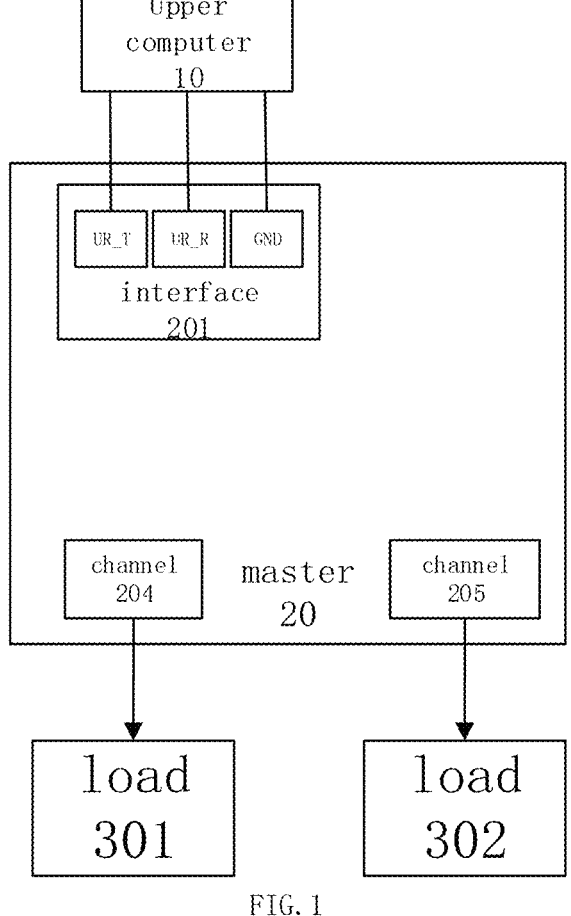
FIG. 1 is an application diagram of a digital power supply with adjustable power-on time interval and slew rate provided according to an embodiment of the present disclosure.

The embodiment of the present disclosure provides an application schematic diagram of a digital power supply with adjustable power-on time interval and slew rate, as shown in FIG. 1, which includes an upper computer 10, a master 20, a load 301 and a load 302, wherein the master 20 includes an interface 201, a channel 204 and a channel 205. The master 201 is equivalent to a digital power supply with adjustable power-on interval and slew rate, the interface 201 is equivalent to the first interface of the main control circuit, and the channels 204 and 205 are respectively equivalent to a power supply adjustable circuit. The upper computer 10 transmits external control parameters through the first interface 201, and the external control parameters refer to the issued configured parameters, such as the output voltage value and the power-on time interval value. In response to external control parameters, the master 20 uses the main control circuit to generate PWM (Pulse-Width Modulation) waves to control the channel 204 and the channel 205 respectively, and outputs electric energy to the load 301 and the load 302 at a certain power-on time interval and slew rate.

The embodiment of the present disclosure provides a digital power supply with adjustable power-on time interval and slew rate, which includes a main control circuit, a power supply circuit and multiple power supply adjustable circuits, wherein the main control circuit is respectively connected to the power supply circuit and each power supply adjustable circuit, The power supply circuit is configured to provide working power for the digital power supply.

The embodiment of the present disclosure provides a schematic diagram of a power supply circuit, as shown in FIG. 4, which schematically shows the circuit connection structure of the power supply circuit U2. It should be understood that the power supply circuit includes but is not limited to the connection mode shown in FIG. 4, as long as the power supply circuit can be configured to provide working power for the digital power supply, usually the power supply circuit is configured to convert 12V to 3.3V, and provide a stable 3.3V working power supply for the digital power supply.

The main control circuit includes a main control device and a first interface, and is configured to respond to external control parameters received by the first interface, and send PWM waves to each power adjustable circuit through the first pair of pins of the main control device.

Figure 2:
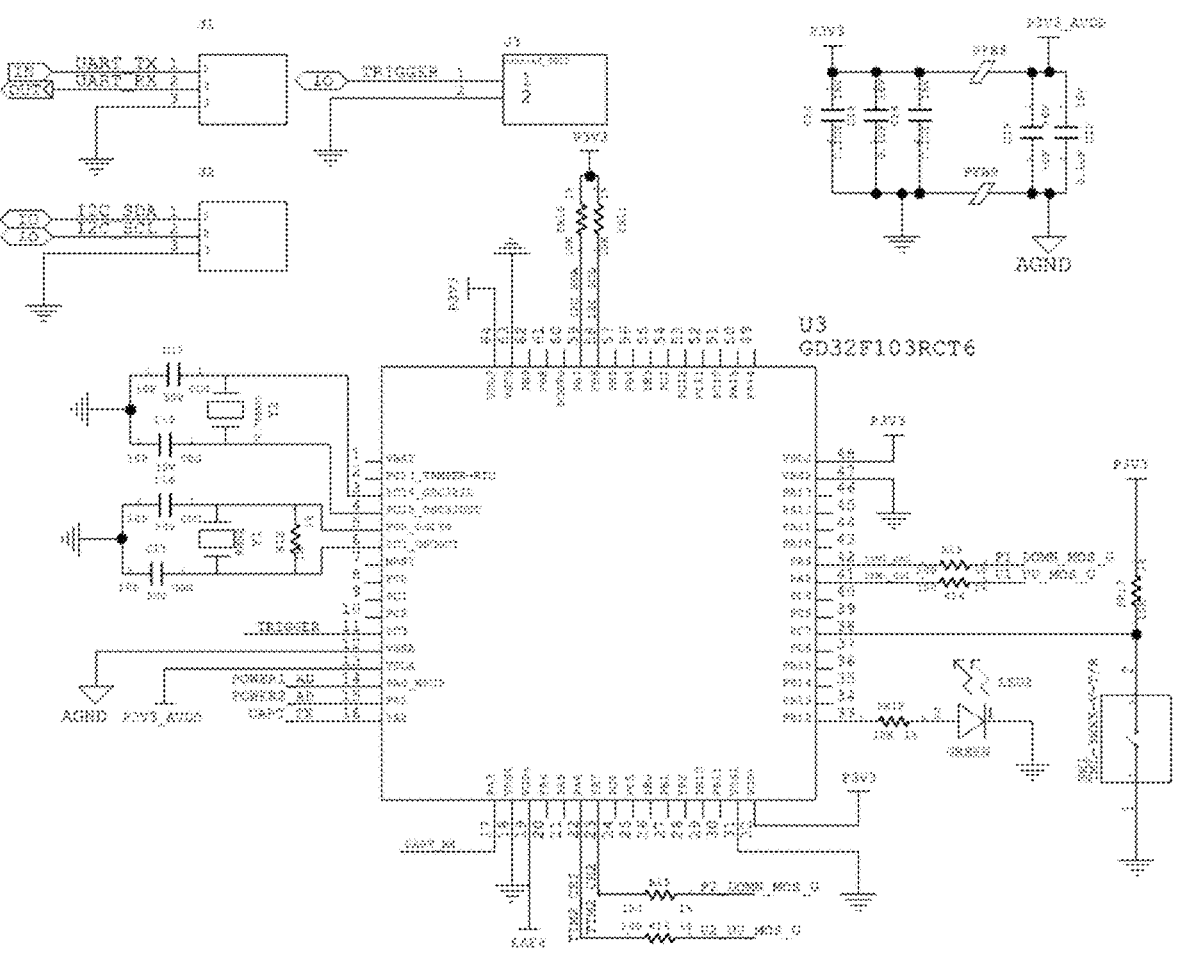
FIG. 2 is a schematic diagram of a main control circuit of a digital power supply with adjustable power-on time interval and slew rate according to an embodiment of the present disclosure.

The embodiment of the present disclosure provides a schematic diagram of a main control circuit. As shown in FIG. 2, the main control circuit includes a main control device U3 and a first interface J1, and the first interface J1 is used to receive external control parameters. In response to the external control parameters, the main control device U3 outputs PWM waves with adjustable duty ratio through the first pair of pins to control each power supply adjustable circuit respectively, so that the output voltage on the POWER1_OUT network or the POWER2_OUT network can be stabilized at a certain set value. In FIG. 2, the first pair of pins is a pair of pins formed by a pin 41 and a pin 42 or a pair of pins formed by a pins and a pin 23, and the first pair of pins refers to a pair of pins connected to each power adjustable circuit. It should be understood that for the convenience of understanding, only two channels are shown in the figure, that is, two power supply adjustable circuits, and the main control circuit includes but is not limited to the connection mode shown in FIG. 2.

Each power supply adjustable circuit includes a first MOS (Metal Oxide Semiconductor), a second MOS and a filter capacitor. The first MOS, the second MOS and the filter capacitor together form a step-down circuit, which is configured to control the on-off of the first MOS and the second MOS in response to the PWM wave of the main control circuit, and output electric energy at a determined power-on time interval and slew rate through the step-down circuit.

Optionally, the embodiment of the present disclosure provides a schematic diagram of a power supply adjustable circuit. As shown in FIG. 3, taking a power supply adjustable circuit as an example, each power supply adjustable circuit includes a first MOS, Q1, a second MOS, Q2 and a filter capacitor C9. The first MOS, the second MOS and the filter capacitor together form a step-down circuit, and the PWM wave transmitted by the main control circuit is received through pins 41 and 42 to control the on-off of the first MOS and the second MOS. The power-on time interval of this power supply is controlled by controlling the power-on timing of the POWER1_OUT network, and the power-on slew rate of the POWER1_OUT network is controlled by controlling the time required for the voltage on the POWER1_OUT network to reach a preset voltage value from 0V.

FIG. 3 schematically shows a circuit connection structure of the power supply adjustable circuit. It should be understood that the power supply adjustable circuit includes but is not limited to the connection mode shown in FIG. 3. The two power supply adjustable circuits shown in FIG. 3 are built by the basic BUCK topology, and the connection structure of each power supply adjustable circuit is the same, so they will not be described here again.

The digital power supply provides working power for the digital power supply by the power supply circuit, and is integrally controlled by the main control circuit including the main control device and the first interface, and outputs voltage by a multi-channel power supply adjustable circuit including a step-down circuit composed of a first MOS, a second MOS and a filter capacitor, wherein each power supply adjustable circuit corresponds to a power supply rail in the SSD, and in this process, external control parameters are received through the first interface in the main control circuit. The main control device is used to generate a PWM wave that responds to external control parameters, and the PWM wave is sent to each power adjustable circuit by the first pair of pins, and the first MOS and the second MOS in each power adjustable circuit are controlled by the PWM wave, and each power adjustable circuit is controlled by the step-down circuit to output a stable voltage at a determined power-on time interval and power-on slew rate.

In an alternative embodiment, the main control circuit is further configured to sample the voltage value of each power supply adjustable circuit, and calculate and output PWM waves through digital PID (Proportional Integration Differentiation) based on the voltage value.

In an alternative embodiment, each power adjustable circuit further includes a feedback resistor and an operational amplifier, wherein the feedback resistor forms a low-pass filter circuit by the operational amplifier, and the low-pass filter circuit is configured to feed back the output voltage value of the corresponding power adjustable circuit in response to the voltage sampling requirement of the main control circuit.

Optionally, as shown in FIG. 3, each power supply adjustable circuit further includes feedback resistors R5 and R6 and an operational amplifier U1. The voltage dividing circuit composed of the feedback resistors R5 and R6 forms a low-pass filter circuit by the operational amplifier U1, and the low-pass filter circuit feeds back the output voltage to the main control device U3.

Optionally, the main control device U3 of the main control circuit samples the voltage value of each power supply adjustable circuit and changes the duty ratio of the output PWM wave by digital PID calculation, so that the power supply can stably output the set voltage value.

In an alternative embodiment, the main control circuit further includes a first frequency crystal oscillator and a second frequency crystal oscillator, and the first frequency crystal oscillator and the second frequency crystal oscillator are configured to provide clock signals.

Optionally, as shown in FIG. 2, the main control circuit further includes a first frequency crystal oscillator Y1 and a second frequency crystal oscillator Y2, wherein the first frequency crystal oscillator Y1 usually adopts an 8 MHz crystal oscillator and the second frequency crystal oscillator Y2 usually adopts a 32.768 KHz crystal oscillator, and the first frequency crystal oscillator Y1 and the second frequency crystal oscillator Y2 provide necessary clock signals for the main control device U3.

In an alternative embodiment, the main control circuit further includes a first indicator light configured to indicate the working state of the main control circuit.

Optionally, as shown in FIG. 2, the main control circuit further includes a first indicator light LED2, which is configured to indicate the working state of the main control circuit. Generally, when the digital power supply is working normally, LED2 is in a constantly lit state, and when the digital power supply malfunctions and enters protection, LED2 is in a flashing state.

In an alternative embodiment, each power supply adjustable circuit further includes a clamping diode configured as an input voltage to protect the downstream circuit.

Optionally, as shown in FIG. 3, each power supply adjustable circuit further includes a clamping diode D1 configured to suppress the input voltage, thereby protecting the downstream circuit when the input voltage is too high.

In an alternative embodiment, each power adjustable circuit further includes a second indicator light configured to indicate whether the corresponding power adjustable circuit has an input voltage.

Optionally, as shown in FIG. 3, each power supply adjustable circuit further includes a second indicator light LED1, which is always on when there is an input voltage.

According to an embodiment of the present disclosure, an embodiment of an adjustment method of a digital power supply with adjustable power-on time interval and slew rate is provided. It should be noted that the steps shown in the flowchart of the attached drawings can be executed in a computer system such as a set of computer-executable instructions, and although the logical order is shown in the flowchart, in some cases, the steps shown or described can be executed in a different order from here.

In an alternative embodiment, the embodiment of the present disclosure provides an adjustment method of a digital power supply with adjustable power-on time interval and slew rate, as shown in FIG. 5, and the method includes the following steps.

S101, generating a PWM wave corresponding to a power adjustable circuit in response to external control parameters received by a first interface.

Optionally, the external control parameters include: output voltage value and power-on time interval value.

In an alternative embodiment, generating a PWM wave corresponding to the power adjustable circuit in response to the external control parameters received by the first interface includes:

sampling the voltage value of the corresponding power adjustable circuit.

Optionally, sampling the voltage value of the corresponding power supply adjustable circuit refers to sampling the output voltage value fed back by the power supply adjustable circuit, wherein the output voltage value fed back by the power supply adjustable circuit refers to a low-pass filter circuit formed by the feedback resistor and the operational amplifier of the power supply adjustable circuit, and the low-pass filter circuit is configured to feed back the output voltage value of the corresponding power supply adjustable circuit in response to the voltage sampling requirement of the main control circuit.

Based on the voltage value, the corresponding PWM wave is generated by digital PID.

Optionally, based on the voltage value, generating the corresponding PWM wave by digital PID means sampling the output voltage value of the power supply adjustable circuit, and changing the duty ratio of the output PWM wave by digital PID calculation, so that the power supply can stably output the output voltage value meeting the external control parameters.

S102, based on the PWM wave, controlling an on-off of a first MOS and a second MOS corresponding to the power adjustable circuit.

S103, acquiring a working power supply.

Alternatively, acquiring the working power refers to acquiring the power supply provided by the power supply circuit.

S104, based on the working power supply, outputting electric energy at a determined power-on time interval and slew rate by the on-off of the first MOS and the second MOS.

In an alternative embodiment, based on the working power supply, outputting electric energy at a determined power-on time interval and slew rate by the on-off of the first MOS and the second MOS, including:

based on the working power supply, controlling the corresponding power supply adjustable circuit to be powered on at a certain time interval by the on-off of the first MOS and the second MOS.

Optionally, based on the working power supply, controlling the power-on of the corresponding power supply adjustable circuit at a certain time interval by the on-off of the first MOS and the second MOS means controlling the power-on timing of the corresponding power supply adjustable circuit by the on-off of the first MOS and the second MOS, to control the power-on time interval of this power supply.

Based on the working power supply, controlling the corresponding power supply adjustable circuit to reach a preset electric energy at a certain time by the on-off of the first MOS and the second MOS.

Optionally, based on the working power supply, controlling the corresponding power supply adjustable circuit to reach the preset electric energy at a certain time by the on-off of the first MOS and the second MOS means controlling the time required for the voltage of the corresponding power supply adjustable circuit to reach the output voltage value from 0V by the on-off of the first MOS and the second MOS, thus controlling the power-on slew rate of the power supply.

Figure 6:
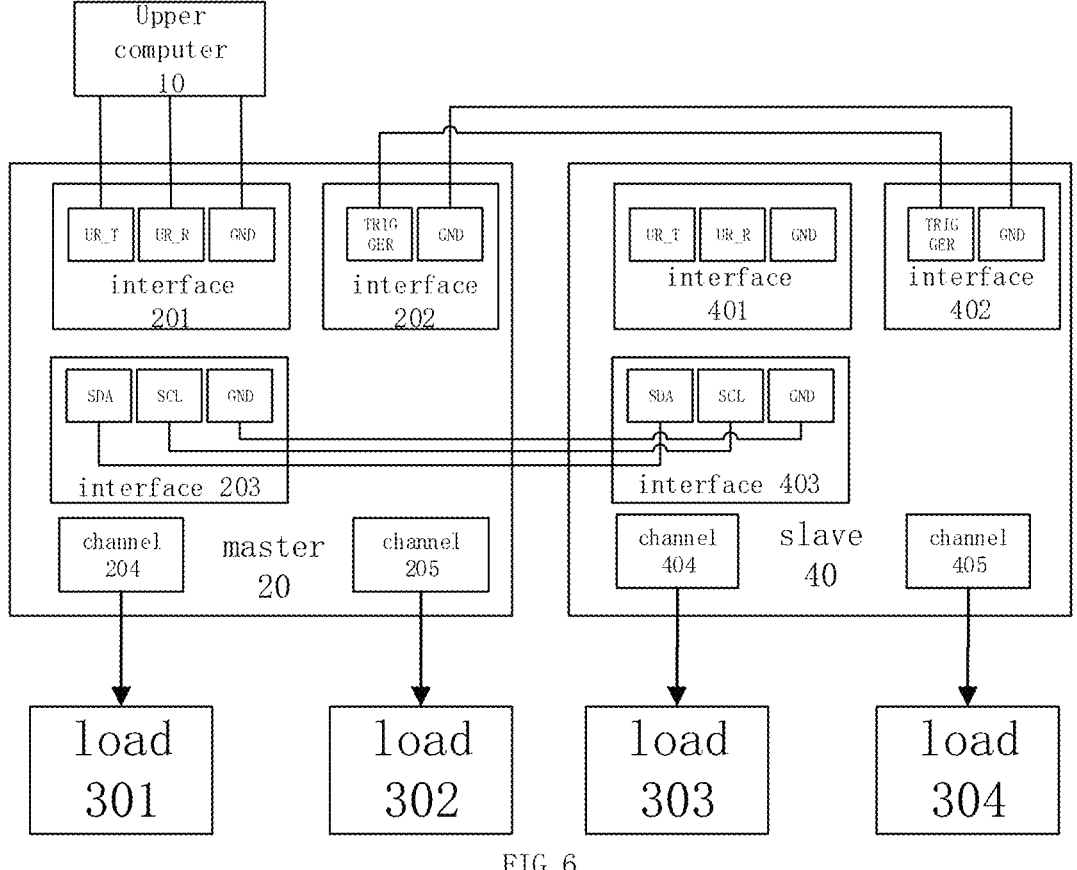
FIG. 6 is an application diagram of a parallel-operable digital power supply with adjustable power-on time interval and slew rate according to an embodiment of the present disclosure.

The embodiment of the present disclosure provides an application schematic diagram of a parallel-operable digital power supply with adjustable power-on time interval and slew rate, as shown in FIG. 6, including: an upper computer 10, a master 20, a slave 40, a load 301, a load 302, a load 303 and a load 304, and the corresponding parts with FIG. 1 in the above embodiments will not be described in detail. See the detailed description of the above embodiments for details. An interface 401 is equivalent to a first interface of the slave 40, the interfaces 202 and 402 correspond to the third interfaces of the master 20 and the slave 40 respectively, and the channels 404 and 405 correspond to a power adjustable circuit of the slave 40 respectively. Interface 203 and interface 403 respectively correspond to the second interface of the master 20 and slave 40. The master 20 transmits external control parameters to the slave 40 through the second interface, and the master 20 sends trigger signals to the slave 40 through the third interface. In response to the external control parameters, the slave 40 uses the main control circuit to generate PWM waves to regulate and control channel 404 and channel 405 respectively, and outputs electric energy to the load 303 and load 304 at a certain power-on time interval and slew rate.

The embodiment of the present disclosure provides a parallel-operable digital power supply with adjustable power-on time interval and slew rate, which includes at least two digital power supplies with adjustable power-on time interval and slew rate in the above embodiments, wherein, the main control circuit further comprises a second interface, a third interface and a transfer switch, wherein the transfer switch is configured to indicate an execution priority of each digital power supply; the second interface is configured to transmit external control parameters between at least two digital power supplies; and the third interface is configured to transmit trigger signals between at least two digital power supplies.

Optionally, the embodiment of the present disclosure provides a schematic diagram of a main control circuit. As shown in FIG. 2, the main control circuit device includes a second interface J2, a third interface J3 and a transfer switch SW1.

Optionally, SW1 is configured to indicate the execution priority of each digital power supply. Take two digital power supplies with adjustable power-on time intervals and slew rate as an example. The first digital power supply is the master and the second digital power supply is the slave, then the transfer switch SW1 of the master can be in an open state at this time, and the corresponding transfer switch SW1 of the slave is in a closed state at this time. In this case, the channel included by the master, that is, the power supply adjustable circuit included by the master, supplies power to the corresponding load first, and then the channel included by the slave, supplies power to the corresponding load then. Similarly, taking three digital power supplies with adjustable power-on time intervals and slew rate as an example, the first digital power supply is the master, the second digital power supply is the slave relative to the first digital power supply, and the third digital power supply is the slave relative to the second digital power supply, and this execution priority is indicated by the transfer switch corresponding to the digital power supply. In this case, the channel included in the first digital power supply first supplies power to the corresponding load, and then the channel included in the second digital power supply supplies power to the corresponding load. Finally, the channel included in the third digital power supply supplies power to the corresponding load. It should be understood that more digital power supplies with adjustable power-on time intervals and slew rates are analogized, and the details will not be repeated.

Optionally, after the master acquires the working power provided by the power supply, the master sends the external control parameters to the second interface of the slave through the second interface. After the master finishes outputting voltage to the corresponding load through the path included in the master, the master sends a trigger signal to the third interface of the slave through the third interface. After receiving the trigger signal, the slave starts the cooperative work of the master and the parallel-operable computer, that is, the parallel-operable computer starts outputting voltage to the corresponding load through the path included in the parallel-operable computer.

In an alternative embodiment, the third interface is a second pair of pins of the main control device, and the at least two digital power supplies comprise a first digital power supply and a second digital power supply, and the execution priority of the first digital power supply is higher than that of the second digital power supply.

The main control circuit of the first digital power supply is configured to send a trigger signal to the second digital power supply through the second pair of pins of the first digital power supply;

The main control circuit of the second digital power supply is configured to respond to the trigger signal, receive external control parameters through the second interface of the second digital power supply, and send PWM waves to each power supply adjustable circuit corresponding to the second digital power supply through the first pair of pins of the main control device of the second digital power supply.

Optionally, the embodiment of the present disclosure provides a schematic diagram of a master control circuit, as shown in FIG. 2. In FIG. 2, the second pair of pins refer to the pins 11, and the second pair of pins refer to the pins connected between the master control device of the master and the master control device of the slave. Wherein, the main control circuit of the second digital power supply is configured to respond to the trigger signal and send PWM waves to each power supply adjustable circuit corresponding to the second digital power supply through the first pair of pins of the main control device of the second digital power supply through the external control parameters received by the second interface of the second digital power supply. The detailed process please refer to the relevant description of the main control circuit in the above embodiments, and will not repeat it again.

By implementing the embodiments of the present disclosure, the parallel-operable digital power supply with adjustable power-on time intervals and slew rates, which includes the second interface, the third interface and the transfer switch, realizes parallel operation of multiple digital power supplies with adjustable power-on time intervals and slew rates. In this process, the external control parameters of the master are transmitted to the slave through the second interface, and after the master finishes the voltage output of the corresponding power supply adjustable circuit, a trigger signal is sent to the slave through the third interface. So that the slave can output the voltage corresponding to the power supply adjustable circuit, thus realizing the parallel use of the master and the slave, and realizing the control and adjustment of the power-on time interval and power-on slew rate of each power supply regulating circuit, that is, realizing multi-channel output of stable voltage with the determined power-on time interval and power-on slew rate.

In an alternative embodiment, the embodiment of the present disclosure provides an adjustment method of a digital power supply with adjustable power-on time interval and slew rate, which is applied to a first digital power supply, wherein the execution priority of the first digital power supply is higher than that of the second digital power supply, as shown in FIG. 7, and the method includes the following steps.

S201, acquiring a first state of a first transfer switch.

Optionally, the first transfer switch refers to the transfer switch of the first digital power supply, and acquiring the first state of the first transfer switch refers to determining the execution priority of the first digital power supply relative to the second digital power supply. In the embodiment of the present disclosure, since the execution priority of the first digital power supply is higher than that of the second digital power supply, the first digital power supply is the master and the second digital power supply is the slave.

S202, based on the first state, generating a first PWM wave corresponding to the power adjustable circuit in response to the external control parameters received by the first interface. For this process, please refer to the description of the main control circuit in the above-mentioned embodiment, and will not be repeated here.

S203, based on the first PWM wave, controlling an on-off of the first MOS and the second MOS corresponding to the power supply adjustable circuit. For this process, please refer to the related descriptions of the main control circuit and the power supply adjustable circuit in the above embodiments, and will not be repeated here.

S204, acquiring a first working power supply.

Optionally, the first working power supply refers to the working power supply provided by the power supply circuit in the first digital power supply.

S205, based on the first working power supply, by the on-off of the first MOS and the second MOS, outputting electric energy at a determined power-on time interval and slew rate. For this process, please refer to the relevant description of the power supply adjustable circuit in the above-mentioned embodiment, which will not be repeated here.

S206, sending the external control parameters to a second digital power supply through a second interface, and sending a trigger signal to the second digital power supply through a third interface. For this process, please refer to the related descriptions of the second interface and the third interface in the above-mentioned embodiments, and will not be repeated here.

In an optional embodiment, the embodiment of the present disclosure provides an adjustment method of a digital power supply with adjustable power-on time interval and slew rate, which is applied to a second digital power supply, wherein the execution priority of the first digital power supply is higher than that of the second digital power supply, as shown in FIG. 7, and the method includes the following steps.

S207, acquiring a second state of a second transfer switch.

Optionally, the second transfer switch refers to the transfer switch of the second digital power supply, and acquiring the second state of the second transfer switch refers to determining the execution priority of the second digital power supply relative to the first digital power supply. In the embodiment of the present disclosure, since the execution priority of the first digital power supply is higher than that of the second digital power supply, the first digital power supply is the master and the second digital power supply is the slave.

S208, based on the second state, generating a second PWM wave corresponding to the power adjustable circuit by the external control parameters received by the second interface in response to the trigger signal received by the third interface. For this process, please refer to the description of the main control circuit in the above-mentioned embodiment, and will not be repeated here.

S209, based on the second PWM wave, controlling an on-off of a third MOS and a fourth MOS corresponding to the power adjustable circuit. For this process, please refer to the related descriptions of the main control circuit and the power supply adjustable circuit in the above embodiments, and will not be repeated here.

S210, acquiring a second working power supply.

Optionally, the second working power supply refers to the working power supply provided by the power supply circuit in the second digital power supply.

S211, based on the second working power supply, outputting an electric power at a determined power-on time interval and slew rate by the on-ff of the third MOS and the fourth MOS. For this process, please refer to the relevant description of the power supply adjustable circuit in the above-mentioned embodiment, which will not be repeated here.

The embodiment of the present disclosure also provides a computer device, please refer to FIG. 8, which is a structural schematic diagram of a computer device provided by an alternative embodiment of the present disclosure. As shown in FIG. 8, the computer device includes one or more processors 501, a memory 502, and interfaces configured to connect various components, including high-speed interfaces and low-speed interfaces. The components are connected to each other by different buses, and can be installed on a common motherboard or in other ways as needed. A processor may process instructions executed in a computer device, including instructions stored in or on a memory to display graphical information of a GUI (Graphical User Interface) on an external input/output device, such as a display device coupled to an interface. In some alternative embodiments, multiple processors and/or multiple buses can be used with multiple memories and multiple memories, if necessary. Similarly, multiple computer devices can be connected, and each device provides some necessary operations (for example, as a server array, a group of blade servers, or a multiprocessor system). In FIG. 8, a processor 501 is taken as an example.

The processor 501 may be a central processing unit, a network processor or a combination thereof. The processor 501 may also include hardware devices. The hardware device can be an application specific integrated circuit, a programmable logic device or a combination thereof. The programmable logic device can be a complex programmable logic device, a field programmable logic gate array, a generic array logic or any combination thereof.

The memory 502 stores instructions that can be executed by at least one processor 501, so that the at least one processor 501 can execute the method shown in the above embodiment.

The memory 502 may include a storage program area and a storage data area, wherein the storage program area may store an operating system and an application program required by at least one function; The storage data area can store data created according to the use of computer equipment, etc. In addition, the memory 502 may include high-speed random access memory and non-transitory memory, such as at least one disk memory device, flash memory device, or other non-transitory solid-state memory devices. In some alternative embodiments, the memory 502 may optionally include a memory located remotely from the processor 501, and these remote memories may be connected to the computer device through a network. Examples of the above networks include, but are not limited to, the Internet, an intranet, a local area network, a mobile communication network, and combinations thereof.

The memory 502 may include volatile memory, for example, random access memory; The memory can also include non-transitory memory, such as flash memory, hard disk or solid state hard disk; The memory 502 may also include a combination of the above kinds of memories. The computer device also includes a communication interface 503 configured for the computer device to communicate with other devices or communication networks.

The embodiment of the present disclosure also provides a computer non-transitory readable storage medium, and the method according to the embodiment of the present disclosure can be realized in hardware or firmware, or can be realized as a computer code which can be recorded in the non-transitory readable storage medium, or downloaded through a network and originally stored in a remote non-transitory readable storage medium or a non-transitory machine non-transitory readable storage medium and will be stored in a local non-transitory readable storage medium. Thus, the methods described herein can be stored in such a software process on a non-transitory readable storage medium using a general-purpose computer, a special-purpose processor, or programmable or special-purpose hardware. Wherein, the non-transitory readable storage medium can be a magnetic disk, an optical disk, a read-only memory, a random access memory, a flash memory, a hard disk or a solid-state hard disk, etc. Alternatively, the non-transitory readable storage medium may also include a combination of the above kinds of memories. It can be understood that a computer, processor, microprocessor controller or programmable hardware includes a storage component that can store or receive software or computer code, and when the software or computer code is accessed and executed by the computer, processor or hardware, the method shown in the above embodiments is realized.

Although the embodiments of the present disclosure have been described in connection with the drawings, those skilled in the art can make various modifications and variations without departing from the spirit and scope of the present disclosure, and such modifications and variations are all within the scope defined by the appended claims.

The invention claimed is:

1. A digital power supply with adjustable power-on time interval and slew rate, wherein the digital power supply comprises a main control circuit, a power supply circuit and a plurality of power supply adjustable circuits, wherein the main control circuit is respectively connected to the power supply circuit and each power supply adjustable circuit, wherein, the power supply circuit is configured to provide working power for the digital power supply;

the main control circuit comprises a main control device and a first interface, and is configured to respond to external control parameters received by the first interface, and send pulse-width modulation (PWM) waves to each power adjustable circuit through a first pair of pins of the main control device;

each power supply adjustable circuit comprises a first metal oxide semiconductor (MOS), a second MOS and a filter capacitor, wherein the first MOS, the second MOS and the filter capacitor together form a step-down circuit, and the power supply adjustable circuits are configured to control an on-off of the first MOS and the second MOS in response to the PWM waves of the main control circuit, and output electric energy at a determined power-on time interval and slew rate through the step-down circuit.

2. The digital power supply according to claim 1, wherein the main control circuit is further configured to sample a voltage value of each power supply adjustable circuit, and calculate and output PWM waves by digital proportion integration differentiation (PID) based on the voltage value.

3. The digital power supply according to claim 2, wherein each power supply adjustable circuit further comprises a feedback resistor and an operational amplifier, wherein the feedback resistor forms a low-pass filter circuit through the operational amplifier, and the low-pass filter circuit is configured to feed back the output voltage value of the corresponding power supply adjustable circuit in response to a voltage sampling requirement of the main control circuit.

4. The digital power supply according to claim 1, wherein the main control circuit further comprises a first frequency crystal oscillator and a second frequency crystal oscillator, and the first frequency crystal oscillator and the second frequency crystal oscillator are configured to provide clock signals.

5. The digital power supply according to claim 1, wherein the main control circuit further comprises a first indicator light, and the first indicator light is configured to indicate working states of the main control circuit.

6. The digital power supply according to claim 5, wherein the first indicator light is configured to have a long bright state and a blinking state, wherein the long bright state is used to indicate that the working state of the main control circuit is a normal state, and the blinking state is used to indicate that the working state of the main control circuit is a fault state.

7. The digital power supply according to claim 1, wherein each power supply adjustable circuit further comprises a clamping diode, and the clamping diode is configured to receive an input voltage and protect downstream circuits.

8. The digital power supply according to claim 1, wherein each of the power supply adjustable circuits further comprises a second indicator light, and the second indicator is configured to indicate whether the corresponding power supply adjustable circuit has an input voltage.

9. An adjustment method of a digital power supply with an adjustable power-on time interval and slew rate, applied to the digital power supply according to claim 1, comprising:
  generating a PWM wave corresponding to a power adjustable circuit in response to external control parameters received by a first interface;
  based on the PWM wave, controlling an on-off of a first MOS and a second MOS corresponding to the power adjustable circuit;
  acquiring a working power supply;
  based on the working power supply, outputting electric energy at a determined power-on time interval and slew rate by the on-off of the first MOS and the second MOS.

10. The method according to claim 9, wherein generating a PWM wave corresponding to a power adjustable circuit in response to external control parameters received by a first interface comprises:
  sampling a voltage value of the corresponding power adjustable circuit;
  generating a corresponding PWM wave by digital PID based on the voltage value.

11. The method according to claim 10, wherein,
  the power supply adjustable circuit comprises a low-pass filter circuit, and the low-pass filter circuit comprises a feedback resistor and an operational amplifier,
  the sampling a voltage value of the corresponding power adjustable circuit, comprising:
  outputting the voltage value of the corresponding power adjustable circuit by the low-pass filter circuit in the power adjustable circuit, wherein the voltage value is obtained by sampling the power adjustable circuit by the low-pass filter circuit in response to the voltage sampling requirement of the main control circuit.

12. The method according to claim 10, wherein,
  generating a corresponding PWM wave by digital PID based on the voltage value comprises:
  calculating the voltage value by using the digital PID to obtain a target duty ratio of the PWM wave to be output;
  generating the PWM wave of the target duty ratio by the main control device.

13. The method according to claim 9, wherein, based on the working power supply, outputting electric energy at a determined power-on time interval and slew rate by the on-off of the first MOS and the second MOS comprises:
  based on the working power supply, controlling the corresponding power supply adjustable circuit to be powered on at a certain time interval by the on-off of the first MOS and the second MOS;
  based on the working power supply, controlling the corresponding power supply adjustable circuit to reach a preset electric energy at a certain time by the on-off of the first MOS and the second MOS.

14. The method according to claim 13, wherein, based on the working power supply, controlling the corresponding power supply adjustable circuit to be powered on at a certain time interval by the on-off of the first MOS and the second MOS comprises:
  controlling a power-on timing of the corresponding power supply adjustable circuit by the on-off of the first MOS and the second MOS, wherein the power-on timing is used for adjusting a power-on time interval of the power supply adjustable circuit.

15. The method according to claim 13, wherein, based on the working power supply, controlling the corresponding power supply adjustable circuit to reach a preset electric energy at a certain time by the on-off of the first MOS and the second MOS comprises:
  controlling a target time required for the voltage of the power supply adjustable circuit to reach the output voltage value from 0V by the on-off the first MOS and the second MOS, wherein the target time is used for adjusting a power-on slew rate of the power supply adjustable circuit.

16. A parallel-operable digital power supply with an adjustable power-on time interval and slew rate, comprising at least two digital power supplies according to claim 1, wherein,
  the main control circuit further comprises a second interface, a third interface and a transfer switch, wherein the transfer switch is configured to indicate an execution priority of each digital power supply; the second interface is configured to transmit external control parameters between at least two digital power supplies; and the third interface is configured to transmit trigger signals between at least two digital power supplies.

17. The parallel-operable digital power supply according to claim 16, wherein the third interface is a second pair of pins of the main control device, and the at least two digital power supplies comprise a first digital power supply and a second digital power supply, and the execution priority of the first digital power supply is higher than that of the second digital power supply;

the main control circuit of the first digital power supply is configured to send a trigger signal to the second digital power supply through the second pair of pins of the first digital power supply;

the main control circuit of the second digital power supply is configured to respond to the trigger signal, receive external control parameters through the second interface of the second digital power supply, and send PWM waves to each power supply adjustable circuit corresponding to the second digital power supply through the first pair of pins of the main control device of the second digital power supply.

18. A parallel-operable adjustment method of a digital power supply with adjustable power-on time interval and slew rate, applied to a first digital power supply in the parallel-operable digital power supply according to claim 16, wherein the execution priority of the first digital power supply is higher than that of a second digital power supply, comprising:

acquiring a first state of a first transfer switch;

based on the first state, generating a first PWM wave corresponding to the power adjustable circuit in response to the external control parameters received by the first interface;

based on the first PWM wave, controlling an on-off of the first MOS and the second MOS corresponding to the power supply adjustable circuit;

acquiring a first working power supply;

based on the first working power supply, by the on-off of the first MOS and the second MOS, outputting electric energy at a determined power-on time interval and slew rate;

sending the external control parameters to a second digital power supply through a second interface, and sending a trigger signal to the second digital power supply through a third interface.

19. A parallel-operable adjustment method of a digital power supply with adjustable power-on time interval and slew rate, applied to a second digital power supply in the parallel-operable digital power supply according to claim 16, wherein the execution priority of thea first digital power supply is higher than that of the second digital power supply, the method comprising:

acquiring a second state of a second transfer switch;

based on the second state, generating a second PWM wave corresponding to the power adjustable circuit by the external control parameters received by the second interface in response to the trigger signal received by the third interface;

based on the second PWM wave, controlling an on-off of a third MOS and a fourth MOS corresponding to the power adjustable circuit;

acquiring a second working power supply;

based on the second working power supply, outputting an electric power at a determined power-on time interval and slew rate by the on-ff of the third MOS and the fourth MOS.

20. A computer device, comprising:

a memory and a processor, wherein the memory and the processor are in communication connection with each other, and computer instructions are stored in the memory, and the processor executes the computer instructions, to execute the method according to claim 9.

\* \* \* \* \*